United States Patent
Morche et al.

(10) Patent No.: US 12,388,463 B2
(45) Date of Patent: Aug. 12, 2025

(54) MULTICHANNEL TRANSMIT AND/OR RECEIVE SYSTEM COMPRISING AT LEAST N PARALLEL PROCESSING CHANNELS AND METHOD FOR DECORRELATING QUANTIZATION NOISE IN SUCH A SYSTEM

(71) Applicant: COMMISSARIAT A L'ENERGIE ATOMIQUE ET AUX ENERGIES ALTERNATIVES, Paris (FR)

(72) Inventors: Dominique Morche, Grenoble (FR); Arnaud Verdant, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 209 days.

(21) Appl. No.: 18/237,842

(22) Filed: Aug. 24, 2023

(65) Prior Publication Data
US 2024/0072822 A1   Feb. 29, 2024

(30) Foreign Application Priority Data
Aug. 30, 2022   (FR) ..................................... 2208649

(51) Int. Cl.
*H03M 3/00*   (2006.01)
*H03M 1/08*   (2006.01)

(52) U.S. Cl.
CPC ......... *H03M 3/352* (2013.01); *H03M 1/0854* (2013.01); *H03M 3/424* (2013.01)

(58) Field of Classification Search
CPC ........ H03M 3/454; H03M 3/50; H03M 3/414; H03M 3/368; H03M 3/43; H03M 3/418;
(Continued)

(56) References Cited

U.S. PATENT DOCUMENTS 5,103,229 A * 4/1992 Ribner .................. H03M 3/414
                                                           341/200
5,706,722 A * 1/1998 Kurten .................... B41F 15/14
                                                           101/124
(Continued)

FOREIGN PATENT DOCUMENTS

WO   2020/105040 A1   5/2020

OTHER PUBLICATIONS

Rosa, "Sigma-Delta Modulators: Tutorial Overview, Design Guide, and State-of-the-Art Survey", IEEE Transactions on Circuits and Systems I: Regular Papers, vol. 58, Issue 1, 2011.
(Continued)

*Primary Examiner* — Linh V Nguyen
(74) *Attorney, Agent, or Firm* — BakerHostetler

(57) ABSTRACT

A multichannel transmit and/or receive system, each channel includes a DAC and a sigma-delta modulator the transfer function of which is expressed thus:

$$OUT(z) = IN(z) \cdot FTS(z) + Q(z) \cdot FTB(z),$$

where OUT is the output signal of the sigma-delta modulator, IN is the input signal of the sigma-delta modulator, FTS is the transfer function of the input signal, Q is the quantization noise and FTB is the transfer function of the quantization noise, the second terms of the transfer function of the sigma-delta modulator only being distinct from one another for two channels Vi, Vj, in order to decorrelate the quantization noise of distinct channels, the first term of said transfer function for channel Vi being equal to the first term of said transfer function for channel Vj.

10 Claims, 7 Drawing Sheets

(58) Field of Classification Search
CPC ...... H03M 3/452; H03M 3/436; H03M 3/482;
H03M 3/502; H03M 3/38; H03M 3/40;
H03M 3/458; H03M 7/3026; H03M 3/30;
H03M 3/344; H03M 3/39; H03M 3/392;
H03M 3/402; H03M 3/438; H03M 3/45;
H03M 3/456; H03M 3/46; H03M 3/32;
H03M 3/326; H03M 3/464; H03M 3/47;
H03M 3/496; H03M 3/468; H03M 7/3022
USPC ............................................................ 341/143
See application file for complete search history.

(56) References Cited

U.S. PATENT DOCUMENTS

| | | | | |
|---|---|---|---|---|
| 5,825,253 A | * | 10/1998 | Mathe | H03L 7/183 |
| | | | | 455/260 |
| 6,005,506 A | * | 12/1999 | Bazarjani | H04B 1/26 |
| | | | | 375/322 |
| 6,535,154 B1 | * | 3/2003 | Sculley | H03M 1/0668 |
| | | | | 341/118 |
| 6,781,533 B2 | * | 8/2004 | Yap | H03M 3/496 |
| | | | | 341/143 |
| 7,176,820 B1 | * | 2/2007 | Fuller | H03M 3/47 |
| | | | | 341/143 |
| 7,180,432 B2 | * | 2/2007 | Oliaei | H03M 3/40 |
| | | | | 341/143 |
| 9,419,673 B2 | * | 8/2016 | Dehos | H04B 1/408 |
| 2013/0021180 A1 | * | 1/2013 | Shabra | H03M 3/326 |
| | | | | 341/110 |
| 2017/0012679 A1 | | 1/2017 | Gustavsson et al. | |
| 2019/0215034 A1 | * | 7/2019 | Breems | H04B 7/04 |
| 2020/0166606 A1 | * | 5/2020 | Oshima | G01S 13/34 |

OTHER PUBLICATIONS

Aziz, et al., "Multi band sigma delta analog to digital conversion", Proceedings of ICASSP '94. IEEE International Conference on Acoustics, Speech and Signal Processing, 1994.

* cited by examiner

MULTICHANNEL TRANSMIT AND/OR RECEIVE SYSTEM COMPRISING AT LEAST N PARALLEL PROCESSING CHANNELS AND METHOD FOR DECORRELATING QUANTIZATION NOISE IN SUCH A SYSTEM

CROSS-REFERENCE TO RELATED APPLICATION

This application claims priority to foreign French patent application No. FR 2208649, filed on Aug. 30, 2022, the disclosure of which is incorporated by reference in its entirety.

FIELD OF THE INVENTION

The invention relates to the field of multichannel transmit or receive systems.

BACKGROUND

One example of an architecture of a radio-frequency multichannel transmit-receive system is shown in FIG. 1, it comprising a plurality of parallel transmit and receive processing channels, for I signals and for Q signals in a quadrature setup. Each transmit channel in fact comprises one I channel and one Q channel, each for processing the corresponding component of the input signal, which comprises two components in quadrature. Each of the I and Q channels especially comprises a digital-to-analogue converter (DAC), a low-pass shaping filter, and a frequency-conversion stage. Each transmit channel further comprises an amplifier and a transmit antenna. Each receive channel especially comprises a receive antenna, a bandpass filter, an amplifier, and also comprises an I channel and a Q channel each comprising a frequency-conversion stage, a low-pass filter and an analogue-to-digital converter (ADC).

It is often necessary, in architectures of this type, which are for example used to carry out digital beamforming, to have a high number of these channels in parallel, in order to obtain a high gain in the targeted direction. This high number of channels leads to a large silicon footprint and may lead to a high number of inputs/outputs. To limit the number of inputs/outputs, it is possible to input the same digital signal into all the (I and respectively Q) channels, and to carry out the beamforming by employing a different delay (and/or by phase-shifting the signals) on each of the channels, so as to compensate for the time-of-flight difference between the signals. Even if baseband processing is integrated into the chip, having a single input will make digital routing less complex. The delay may also be integrated into the DAC, by using the clock of the DAC to generate all or some of the delay.

To obtain a good signal-to-noise ratio (SNR) over the bandwidth of the signal and to achieve a high bit rate, it is advantageous to employ a DAC of high bit depth in order to reduce quantization noise. The increase in modulation order in current systems is tending to increase SNR constraints and therefore to increase the required DAC bit depth. This high bit depth is detrimental because it requires a DAC of substantial complexity (leading to a large footprint and high power consumption). The constraint on the SNR of the DAC is all the more severe because, when each DAC receives the same signal, the quantization noise will be the same on all the channels; this noise adds coherently during beam formation and its power increases as $20 \log(N)$ where N is the number of channels.

Solutions exist that try to reduce the correlation of the quantization noise between the channels. Different dither may be injected on each of the channels. This allows the increase in quantization noise to be limited to $10 \log(N)$. However, this solution increases complexity since it is necessary to make provision for N uncorrelated noise sources, inject the generated noise into the DAC in analogue form, then remove this signal from the output. This dither will potentially increase the constraint in respect of the dynamic range of the signal, and, by increasing the signal flowing through the DAC, may place severe linearity constraints on this DAC.

One of the solutions used in the prior art is to position a sigma-delta modulator upstream of the DAC: see WO2020105040 A1. This solution makes it possible to reduce the bit depth of the DAC (and therefore to reduce its power consumption and its footprint) at the cost of the high sampling frequency required to obtain the good over-sampling factor needed by the sigma-delta encoding. This constraint is not necessarily detrimental in transmit architectures since it is common to use a high sampling frequency in the transmit DAC so as not to excessively constrain the analogue filter following this DAC. One of the drawbacks of this architecture is that quantization noise, the power of which increases with frequency from the end of the bandwidth of the signal, must be filtered out by an analogue filter with a low cut-off frequency. This places severe constraints on the analogue filter.

When a sigma-delta modulator is used for data compression, there are simple solutions allowing the quantization noise of all the channels to be decorrelated. Some of these solutions are described in WO2020105040 A1.

A first solution consists in carrying out data manipulation between the output of the sigma-delta modulator and the input of the digital-analogue converter. This solution is of limited interest since, when the number of channels is high, long sequences must be permuted for a sufficient number of different combinations to be obtained, this increasing the complexity of the data-mixing stage.

The other solutions consist in modifying the sigma-delta modulators differently on each of the channels. One solution is to add a constant value (dc offset) to the input of the 1-bit quantizer. This option is simple to use, but it has the drawback of not breaking the rhythm of periodic sequences of the sigma-delta modulator, and hence identical "tones" on separate channels will not be decorrelated (noise concentration at nearby frequencies). Another solution of the same type consists in starting the sigma-delta modulators at different times. This is an entirely effective way of decorrelating quantization noise, but, as in the previous case, there will potentially be, on each of the channels, noise sequences that will just be offset from one another and that will therefore have tones at the same frequencies. Another solution is to employ different initial states in each of the channels, this leading to the same type of result.

A third type of proposed solution consists in modifying the coefficients of the filter of the sigma-delta modulator differently on each of the channels. Thus, the sequences of the modulator will be different from one another and the noise will not be correlated. The drawback is that the stability of the sigma-delta modulator is jeopardized (by modifying the coefficients, the poles are modified) and the transfer function of the input signal is modified which will potentially disrupt the quality of the transmit system.

Thus, very simple solutions exist that do not impact the signal, but that do not completely decorrelate the noise of one channel from the noise of the other channels, this potentially posing a risk if the noise is not completely white, and more complex solutions exist that may have an impact on the signal itself, by modifying the transfer function of the signal and creating a risk of instability.

SUMMARY OF THE INVENTION

Thus, according to a first aspect, the present invention describes a multichannel transmit and/or receive system comprising at least N parallel processing channels, N≥2, each coupled to one transducer and each comprising a converter block comprising an ADC or DAC converter and a sigma-delta modulator,
the transfer function of the sigma-delta modulator of each channel Vi, i=1 to N, being defined as a sum of two terms comprising a first term $IN(z) \cdot FTS(z)$ relating to the signal and a second term $Q(z) \cdot FTB(z)$ relating to the quantization noise and being expressed thus:

$$OUT(z)=IN(z) \cdot FTS(z)+Q(z) \cdot FTB(z),$$

where OUT is the output signal of the sigma-delta modulator, IN is the input signal of the sigma-delta modulator, FTS is the transfer function of the input signal, Q is the quantization noise and FTB is the transfer function of the quantization noise,
the transfer function of the sigma-delta modulator of a channel Vi being distinct from the transfer function of the sigma-delta modulator of a channel Vj, i and j being distinct integers comprised between 1 and N, in order to decorrelate the quantization noise of distinct channels,
said multichannel system being characterized in that the second terms of the transfer function of the sigma-delta modulator only are distinct, the first term of said transfer function for channel Vi being equal to that for channel Vj.

Thus, the invention makes it possible to prevent quantization noise generated by various channels from adding coherently, without having the aforementioned drawbacks of the solutions of the prior art: the transfer function of the signal is not modified between the various channels, and the signal quality and stability are ensured.

In some embodiments, such a system will further comprise at least one of the following features:
the sigma-delta modulator on each of the channels Vi, Vj comprises a 1-bit hysteresis quantizer, and the hysteresis cycle is different between the channels Vi, Vj in amplitude and/or temporally;
the sigma-delta modulator on each of the channels Vi, Vj comprises a multibit quantizer, and the value of the input signal corresponding to the switch between two quantization levels on channel Vi is set so as to be distinct from the value of the input signal corresponding to the switch between the same two quantization levels on channel Vj;
the multichannel transmit and/or receive system comprises, on each of the channels Vi, Vj, at least said sigma-delta modulator with multi-bit quantizer and an additional sigma-delta modulator, the output of one of said modulators being input into the other of said modulators, said other sigma-delta modulator on the channel Vi being identical to said other sigma-delta modulator on the channel Vj;
the multichannel transmit and/or receive system comprises, on each of the channels Vi, Vj, a delta-sigma modulator of cascaded architecture comprising at least two stages, the first stage comprising a first delta-sigma modulator especially comprising a quantizer and the second stage comprising at least a second sigma-delta modulator;
the second stage being configured to receive as input the output of the quantizer of the first modulator and the input of the quantizer of the first modulator, to digitize, via the second comparator, a signal representative of the quantization noise of the first modulator and to shape it;
the difference between a signal proportional to the output of the quantizer of the first modulator and a signal proportional to the input of the quantizer of the first modulator being input into the second modulator;
the output of the second stage then being subtracted from the output of the first modulator to deliver a signal devoid of at least some of the quantization noise of the first stage, wherein the second stage of channel Vi is different from the second stage on channel Vj so as to differentiate between the quantization noise of the second modulator of channels Vi, Vj;
the second stage comprises multipliers, each multiplier multiplying its input by a respective associated coefficient, wherein, considering at least one of said multipliers, the coefficient associated with it on channel Vi has a value different from the coefficient associated with it on channel Vj;
a delay-generating block is placed, in the second stage, between the output of the first modulator and the input of the second modulator, said delay-generating block being configured to apply a delay to the signal delivered by said output, the delay on channel Vi being set to a value different from the value of the delay on channel Vj.

According to another aspect, the invention describes a method for decorrelating quantization noise in a multichannel transmit and/or receive system comprising at least N parallel processing channels, N≥2, each coupled to one transducer and each comprising a converter block comprising an ADC or DAC converter and a sigma-delta modulator,
the transfer function of the sigma-delta modulator of each channel Vi, i=1 to N, being defined as a sum of two terms comprising a first term $IN(z) \cdot FTS(z)$ relating to the signal and a second term $Q(z) \cdot FTB(z)$ relating to the quantization noise and being expressed thus:

$$OUT(z)=IN(z) \cdot FTS(z)+Q(z) \cdot FTB(z),$$

where OUT is the output signal of the sigma-delta modulator, IN is the input signal of the sigma-delta modulator, FTS is the transfer function of the input signal, Q is the quantization noise and FTB is the transfer function of the quantization noise,
in which method the operation of the sigma-delta modulator of channel Vi is configured with respect to the operation of the sigma-delta modulator of channel Vj to decorrelate the quantization noise generated by the channels,
the transfer function of the sigma-delta modulator of a channel Vi being distinct from the transfer function of the sigma-delta modulator of a channel Vj, i and j being distinct integers comprised between 1 and N, in order to decorrelate the quantization noise of distinct channels,
said method being characterized in that the second terms of the transfer function of the sigma-delta modulator only are distinct, the first term of said transfer function for channel Vi being equal to that for channel Vj.

In some embodiments, such a method will further comprise at least one of the following features:
the sigma-delta modulator on each of the channels Vi, Vj comprises a 1-bit hysteresis quantizer, and the hysteresis cycle is different between the channels Vi, Vj in amplitude and/or temporally;
the sigma-delta modulator on each of the channels Vi, Vj comprises a multibit quantizer, and the value of the input signal corresponding to the switch between two quantization levels on channel Vi is set so as to be distinct from the value of the input signal corresponding to the switch between the same two quantization levels on channel Vj.

BRIEF DESCRIPTION OF THE DRAWINGS

The invention will be better understood and other features, details and advantages will become more clearly apparent on reading the following non-limiting description, and by virtue of the appended figures, which are given by way of example.

Identical references may be used in different figures to designate identical or comparable elements.

DETAILED DESCRIPTION

Figure 1:
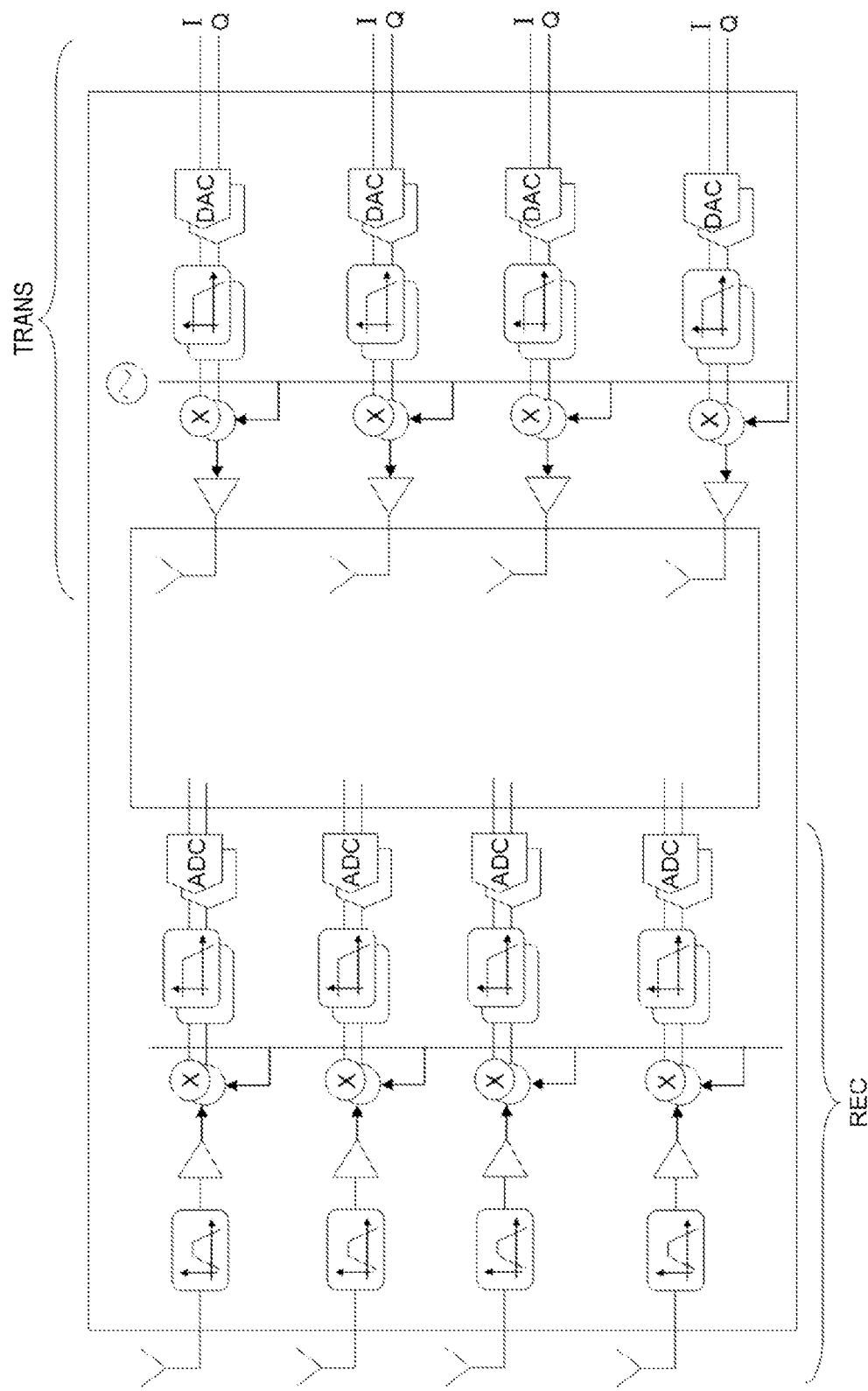
FIG. 1 is an illustration of an architecture of a multichannel transmit-receive system according to the prior art (PrA)
Figure 2:
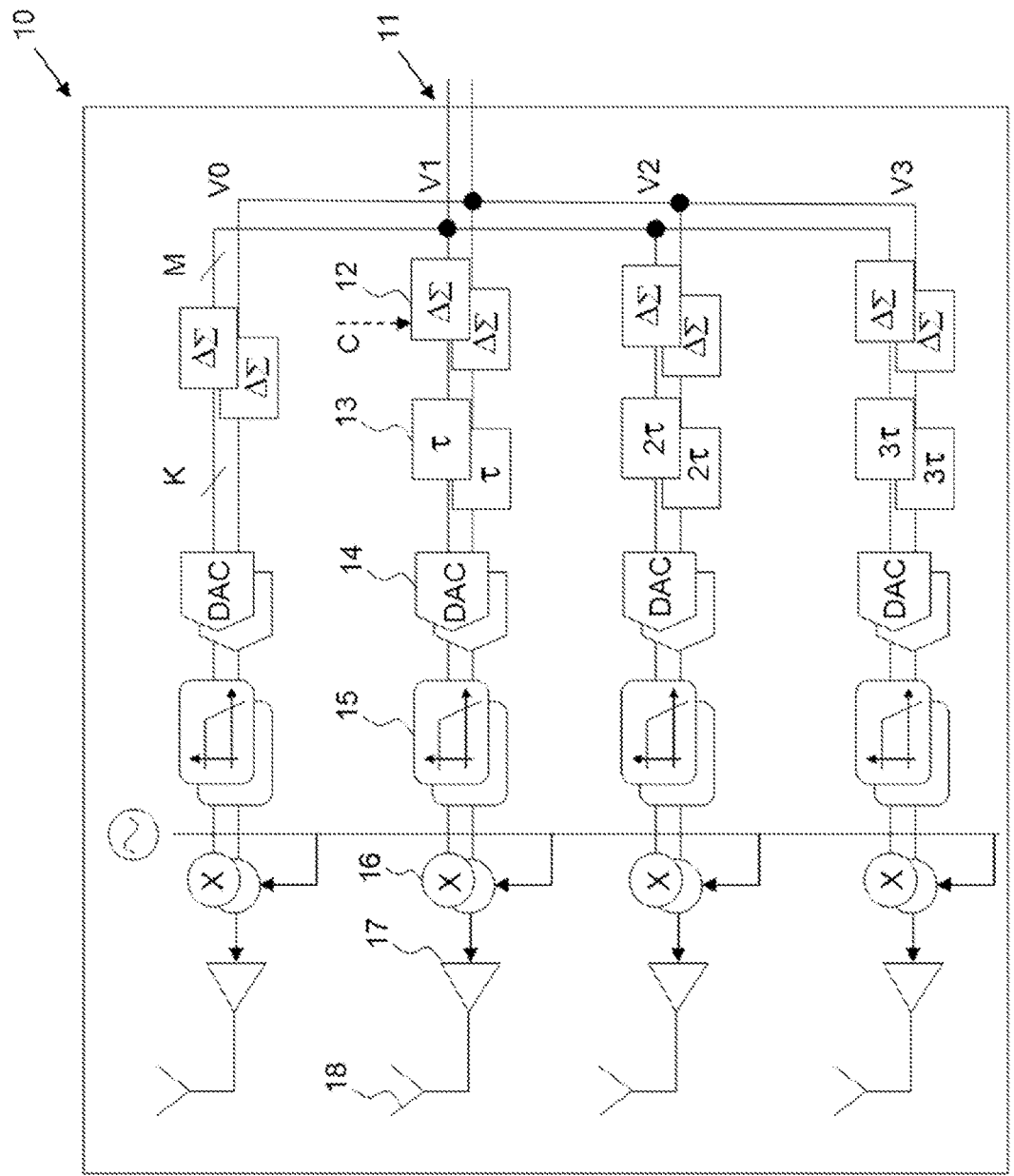
FIG. 2 is an illustration of a multichannel transmit system in one embodiment of the invention.

A multichannel, radio-frequency for example, transmit system 10 implemented in the context of a millimetre-wave beamforming application comprises, in one embodiment of the invention illustrated in FIG. 2, a digital-to-analogue conversion block integrated, for example, into an SoC and comprising N parallel processing channels Vi, i=0 to N−1, with N an integer greater than or equal to 2. In the case shown, N is equal to 4.

It will be noted that each processing channel Vi in fact comprises two channels, one I channel and one Q channel, each for processing the corresponding component of the input signal, which comprises two components in quadrature. When reference is made to each processing channel below, what is meant is each processing channel among the N channels for processing the I signal for example (or each processing channel among the N channels for processing the Q signal).

Each processing channel Vi receives as input the same digital signal 11.

Each processing channel Vi, i=0 to N−1, comprises, in succession, a sigma-delta modulator 12, a delay-generating element 13 that delays the signal by a delay i·τ, a digital-to-analogue converter 14, a low-pass filter 15, a frequency-conversion stage 16 allowing transfer to a carrier, and an amplifier 17, and is coupled to a radio-frequency transmit antenna 18.

In embodiments, the transmit system 10 comprises a control block (not shown), configured to generate control signals C intended for the sigma-delta modulators 12, with a view to controlling the decorrelation of the quantization noise as required.

The sigma-delta modulator is here a digital-to-digital sigma-delta modulator that receives a string of bits, with a precision of M bits, and delivers a string of bits with a precision of K bits, with K<M, and K and M being integers.

A sigma-delta modulator 12, as is known, is a feedback-loop-based device that carries out encoding using a small number of bits (for example equal to 1, to 2, fewer than 5, etc.) and at a sampling frequency that is high compared to the bandwidth of the signal to be encoded. This device shapes the spectrum of the quantization noise, shifting its power to a frequency band not occupied by the spectrum of the payload signal. This spectral separation makes it possible, by virtue of filtering of the encoded signal, to keep the signal-to-noise ratio compliant with given specifications.

A sigma-delta modulator generally comprises:
an input, for receiving an input signal that, depending on the use case, is either analogue or, as in the example in question, digital, and encoded on M bits;
an output, for delivering an output digital value encoded on K bits; and
one or more sigma-delta cells placed between the input and the output of the modulator.

Each cell may be first-order or higher-order. Notably, some of them may be first-order, and others higher-order.

Each sigma-delta cell comprises at least the following elements:
a subtractor comprising a first input, a second input, and an output, the first input being coupled to the input of the modulator to receive the input signal or a value derived therefrom;
an integrator comprising an input coupled to the output of the subtractor, and an output; and
a quantizer having an input coupled to the output of the integrator and an output coupled to the second input of the subtractor; the output of the quantizer is, furthermore, coupled to the output of the modulator so as to deliver the output digital value or a contribution thereto.

Each sigma-delta cell is characterized by its transfer function, relating its output signal OUT to its input signal IN and to the quantization noise Q of the quantizer. The transfer function (transformed to z) is written thus:

$$\mathrm{OUT}(z) = \mathrm{IN}(z) \cdot \mathrm{STF}(z) + Q(z) \cdot \mathrm{NTF}(z)$$

where STF is the input signal transfer function and NTF is the noise transfer function, these functions here being expressed as a function of frequency, and Q is the quantization noise, which is equal to the difference between the output of the quantizer and the input of the quantizer.

Figure 3:
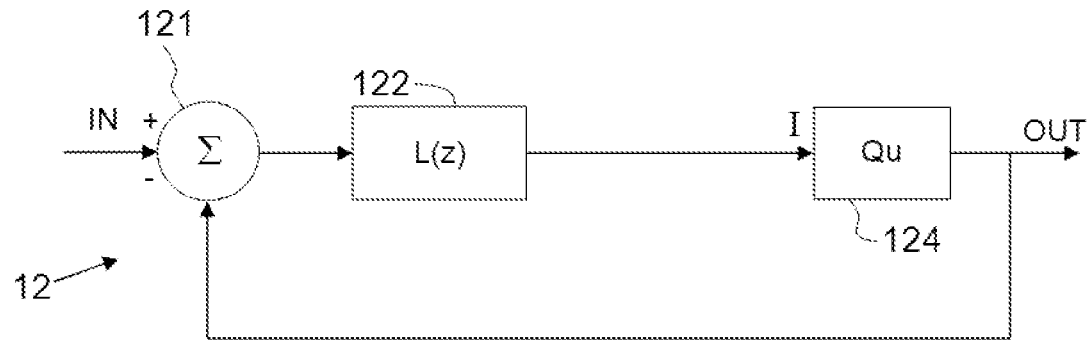
FIG. 3 is a schematic of a first-order single-cell sigma-delta modulator.

FIG. 3 schematically shows a sigma-delta modulator 12 employing a first-order cell, with an input signal IN, an output signal OUT, a subtractor 121, an integrator 122 and a quantizer 124.

L is the loop filter. It is, as known, a low-pass filter with a very high gain at low frequencies. The loop filter may be implemented as a simple integrator or a cascade of integrators (when the input signal is analogue, a DAC is furthermore placed in the feedback path to take the digital output signal and feed it back to the analogue input of the subtractor).

In the case of FIG. 3, $$STF(f) = \frac{L(f)}{1+L(f)}$$

and $$NTF(f) = \frac{1}{1+L(f)}.$$

The transfer function of the input signal has a gain of 1 in the bandwidth of interest. The noise transfer function is a high-pass filter that shapes the noise: the quantization noise is highly attenuated at low frequencies while being increased at high out-of-band frequencies.

The invention consists in decorrelating quantization noise between the various channels by acting only on the "Q·NTF(z)" part, the signal transfer function not being modified so as to guarantee the stability and quality of the signal. The "IN·STF(z)" part is therefore the same for all the various processing channels (this avoiding the need to carry out stability tests during the design of the transmit system, in contrast to the solutions of WO2020105040 A1), the "Q·NTF(z)" part differing for at least certain of the channels.

In a first embodiment of the invention, the quantization noise is decorrelated between two processing channels through use, in the sigma-delta modulator 12 of each channel, of a 1-bit hysteresis quantizer, the hysteresis applied on a channel Vi being different from the noise applied on the channel Vj, with i, j distinct integers comprised between 0 and N.

Figure 4:
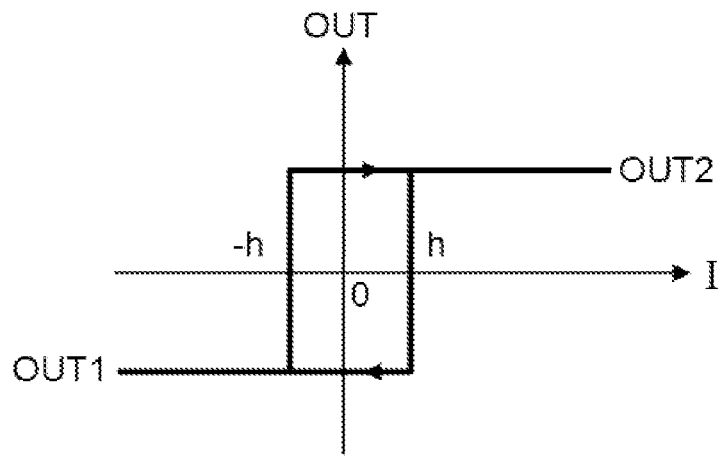
FIG. 4 is a graph showing the behaviour of a quantizer of a sigma-delta modulator with two output levels in one embodiment of the invention.

In such a case, with reference to FIG. 4:
- instead of having, on each processing channel, the output of the quantizer switching between OUT1 and OUT2 (the two quantization levels of the 1-bit quantizer) when I crosses the threshold value (of value 0 in FIG. 4, but the threshold value may take another predetermined value in other embodiments),
- the transfer function of the quantizer 124 is modified so that the operation is as follows:
- when the signal I is less than the threshold value, the switching value is equal to threshold 1, less than the threshold value (in the case shown in FIG. 4: threshold value−h, with h a real number) and when the signal I is greater than the threshold value, the switching value is equal to threshold 2, greater than the threshold value (in the case shown in FIG. 4: threshold value+h).

The threshold value around which hysteresis takes place is the same for both the channels Vi, Vj.

Figure 5:
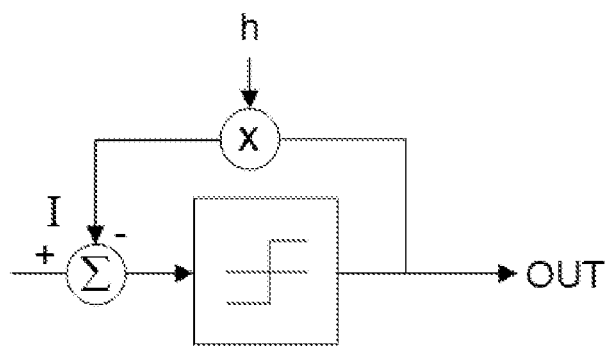
FIG. 5 illustrates one embodiment of a quantizer exhibiting the behaviour of FIG. 4.

FIG. 5 illustrates a possible functional implementation of such a 1-bit hysteresis quantizer (or comparator), implementing a zero comparator and a multiplier.

Figure 6:
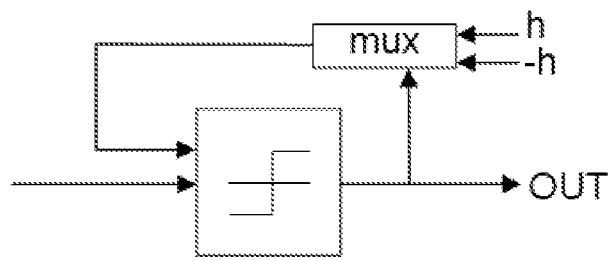
FIG. 6 illustrates another embodiment of a quantizer exhibiting the behaviour of FIG. 4.

Another solution in respect of functional implementation is to use, as shown in FIG. 6, a threshold comparator and a multiplexer that will choose h or −h depending on the output level of the comparator, this avoiding the need for a multiplier.

In this embodiment, hysteresis values that are different from one another are used on the distinct channels Vi, Vj.

Thus, even with the same constant input 11, the noise will have different cycles and will be decorrelated.

The respective hysteresis values are for example controlled via a command C generated by the control block.

The hysteresis will have a low value (h for example of value less than or equal to $\frac{1}{10}$, or even less than or equal to $\frac{1}{1000}$ for example) to limit the impact on the quantization noise. Specifically, the greater the hysteresis, the greater the power of the quantization noise will potentially be. Another possibility is for the hysteresis value, h, in each channel (or at least one of the channels) to be controlled so as to vary over time, to limit the impact of this hysteresis.

In one embodiment, the hysteresis values on two distinct channels Vi, Vj are set so that the following minimum differences are respected between the two channels.

In one embodiment, the same hysteresis value h is used on various channels, or even on all the channels, but the hysteresis is controlled (for example by a command C) so as to intervene at different respective times, the transfer functions of the quantizers therefore not being superposed for two distinct channels.

It will be noted that the hysteresis may or may not be inverting, i.e. there may be addition or subtraction in the feedback loop, and the hysteresis cycle may not be symmetrical with respect to the threshold value.

In another embodiment of the invention, the sigma-delta modulator 12 this time comprises a quantizer 124 taking the form of a multibit quantizer, which therefore comprises 3 or more distinct quantization thresholds. In a multichannel system, it is advantageous to reduce the number of bits of the DAC without necessarily aiming for a 1-bit DAC, a 1-bit converter creating a certain number of stability problems in modulators of high order.

Figure 7:
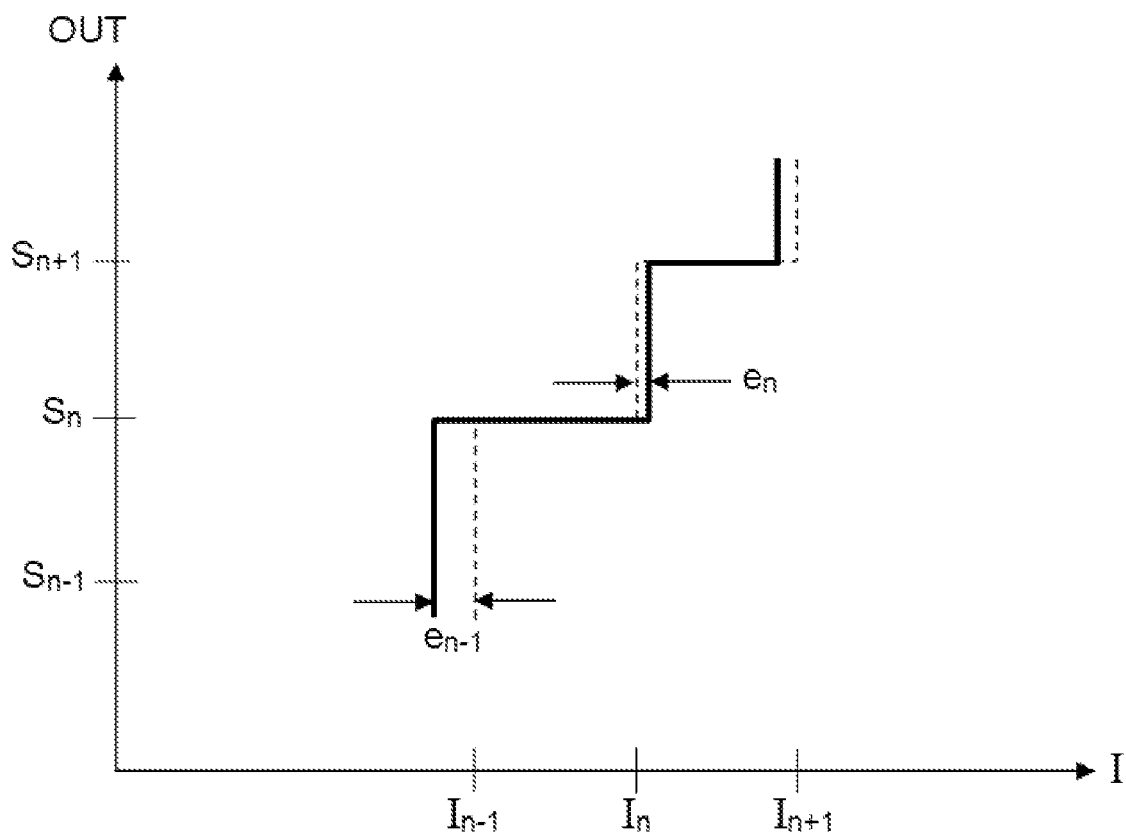
FIG. 7 is a graph showing one portion of the behaviour of a quantizer of a sigma-delta modulator with at least three output levels in one embodiment of the invention.

In this embodiment, one channel is distinguished from another by a channel-specific modification to one or more of the quantization thresholds of the multibit quantizer 124 present in this channel, as shown in FIG. 7.

The dashed transfer function is the "Ideal" transfer function of the quantizer 124 with quantization thresholds $I_1$, $I_2$, ... $I_p$ regularly distributed (for n=1 to p, p being the number of quantization thresholds, the output value OUT is equal to $S_n$ for an input value I comprised between $I_{n-1}$ and $I_n$). The actual transfer function of the quantizer 124 such as implemented is the function represented by the solid line, each or certain of the quantization thresholds of this function being shifted with respect to the ideal transfer function: the output value OUT is equal to $S_n$ for an input value I comprised between ($I_{n-1}-e_{n-1}$) and ($I_n-e_n$). Thus the values of $S_1$, $S_2$, ..., $S_p$, $I_0$, $I_1$, $I_2$, ..., $I_p$, ... are the same from one channel to another, but each shift value $e_0$, ... $e_p$ (or at least one, or even certain thereof) is set so that it varies from one channel to another, allowing the quantization noise to be decorrelated.

In one embodiment, these channel-specific values are controlled by a control signal C generated by the control block.

The impact of this shift will be small since the shift value will be small compared to the quantization increment q—typically the shift values are set so as to be comprised between 0.001q and 0.1q.

Figure 8:
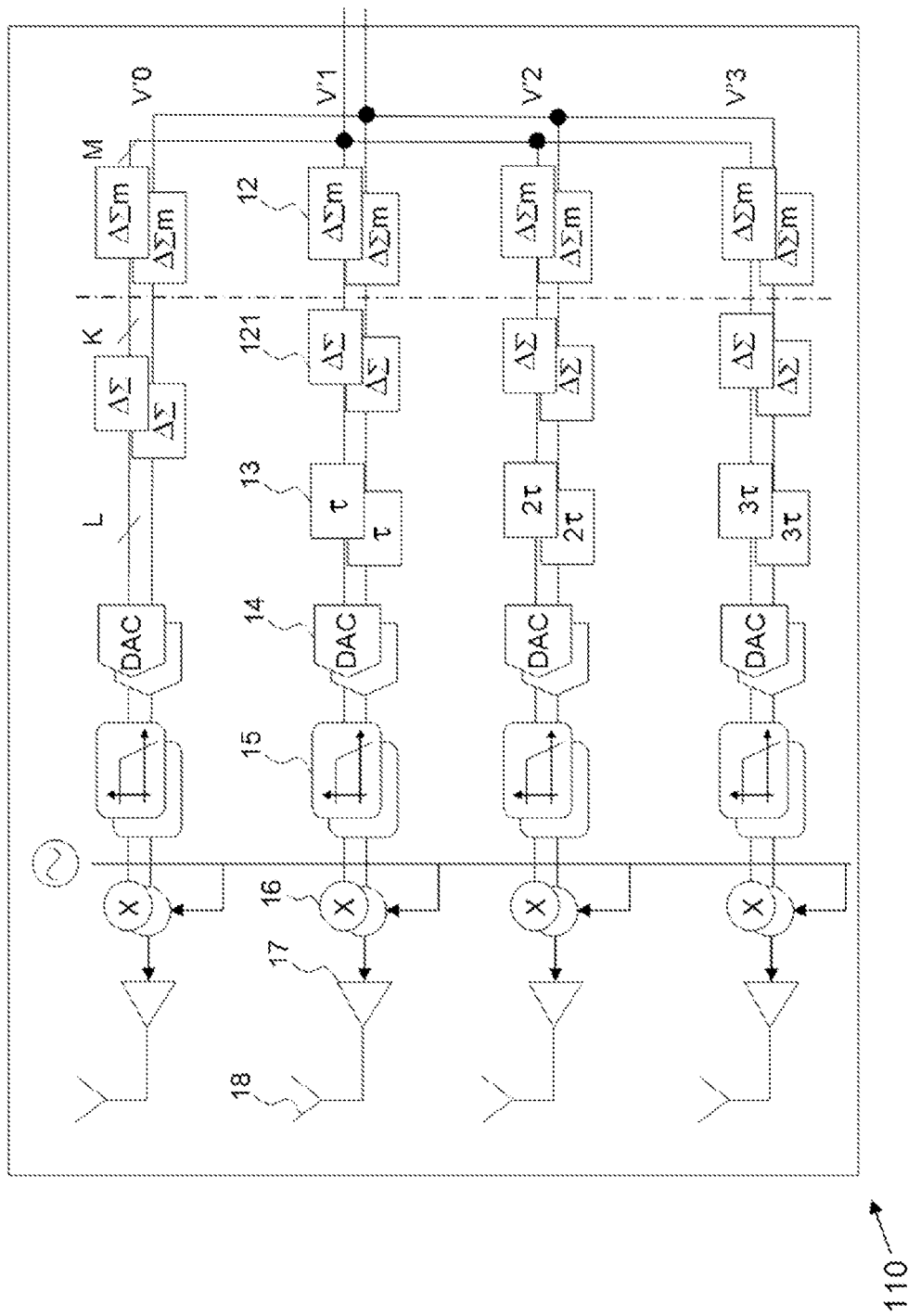
FIG. 8 is an illustration of a multichannel transmit system in one embodiment of the invention.

In one embodiment of a multichannel transmit system 110 implementing this solution and shown in FIG. 8, in each processing channel Vi there are two successive sigma-delta modulators 12, 121, the output of one being connected to the input of the other. The first sigma-delta modulator 12 comprises a multi-bit quantizer the thresholds of which are modified via shift injection as explained above, and which will compress the signal to K bits (K<M) at a sampling frequency Fs1. The number of bits and the sampling rate may be optimized to minimize data rate. The output of this first sigma-delta modulator 12 is then injected into the second sigma-delta modulator 121, which operates at a frequency Fs2 that will further compress the signal, to L bits (L<K), L=1 bit for example. The advantage of this structure is that the signal of the second 1-bit modulator benefits from an input signal with a first-stage quantization noise that is already decorrelated from one channel to another. A filtering and/or oversampling block may be placed between the two modulator stages to optimize the two modulators in a dissociated manner and to filter some of the quantization noise of the first stage. The advantage of this noise introduced in the first quantizer with respect to noise introduced as input is that this noise is shaped by the sigma-delta modulator.

The sigma-delta modulators 121 used on the different channels may, for their part, be identical in one embodiment.

This cascade of two sigma-delta modulators is easier to integrate into the same integrated circuit, and allows the interface represented by the dot-dashed line in FIG. 8 to be better optimized, with respect to the case where a single sigma-delta modulator is used to convert from M bits to L bits (with, in such a case, the following alternative to be respected: either very high resolution with a low bit rate, or very low resolution with a high bit rate) given that the input signal of the modulator 12, which comes from the digital communication system, has a high number of bits (resolution typically of 10 or 12 bits with a bit rate dependent on the modulation of the data and for example of 50 Mb/s), whereas it is desirable to reduce the constraints on the DAC 14 (for example L=1 bit and very high sampling frequency).

Figure 9:
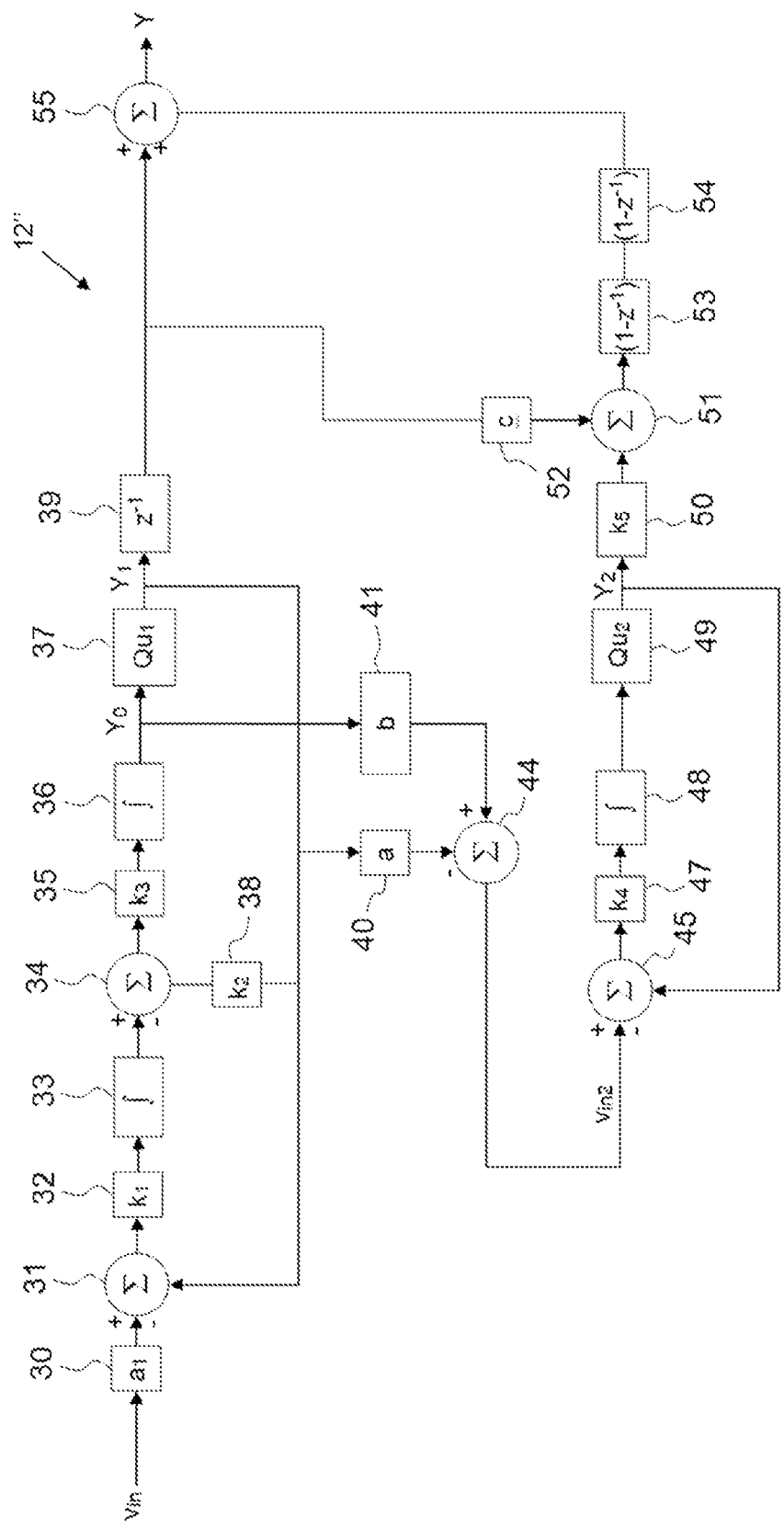
FIG. 9 is an illustration of a two-stage sigma-delta modulator with the known prior-art architecture.

In another embodiment of the invention, the sigma-delta modulator 12 of FIG. 2 is then a sigma-delta modulator of cascaded architecture 12", the—known—architecture of which according to one example is shown in FIG. 9.

This sigma-delta modulator of cascaded architecture 12" comprises, in the case shown, two sigma-delta modulators. The first sigma-delta modulator is here of order 2. It receives as input a signal $v_{in}$ and comprises respective blocks 30, 32, 35, 38 that multiply the signal that is delivered to them as input by a respective coefficient $a_1$, $k_1$, $k_2$, $k_3$, respectively, two integrators 33, 36, a quantizer 37, and two subtractors 31, 34.

The input of the quantizer 37 is input into a multiplier 40 that multiplies it by a coefficient a, the output of the quantizer 37 is input into a multiplier 41 that multiplies it by a coefficient b, and the outputs of the multipliers 40, 41 are input into a subtractor 44 that delivers the signal $v_{in2}$ as input to the second sigma-delta modulator.

The second sigma-delta modulator is here of order 1. It comprises a subtractor 45, a block 47 that multiplies the signal that it receives as input by the respective coefficient $k_4$, an integrator 48 and a quantizer 49.

The output $Y_2$ of the second sigma-delta modulator is added to the output $Y_1$ of the first modulator, and multiplied by the transfer function $z^{-1}$ and by the coefficient c; the result of the sum is multiplied twice by the transfer function $(1-z^{-1})$; and the resulting signal is summed with $Y_1 \cdot z^{-1}$ in the adder 55, which outputs the signal Y.

The operating principle is as follows: the first modulator processes the input signal $v_{in}$ and delivers the digital signal $Y_1$:

$$Y_1(z)=a_1 \cdot v_{in}(z) \cdot FTS1(z)+Q_1(z) \cdot FTB1(z)$$

where $v_{in}(z)$ is the input signal, $Q_1(z)$ is the quantization noise of the quantizer of the first modulator, FTS1(z) is the transfer function of the input signal, and FTB1(z) is the noise transfer function. Here FTS1(z) is equal, approximately, to $z^{-2}$ and FTB1(z) is equal, approximately, to $(1-z^{-1})^2$, the approximation errors being dependent on $k_1$, $k_2$, $k_3$.

The quantization noise of the first quantizer 37 is extracted by taking the difference between the output signal and the input signal in the subtractor 44. The two inputs of the subtractor 44 may be weighted differently (by the coefficients a, b) to compensate for the coefficients inside the first modulator, so as to obtain, as output from the subtractor 44, a signal $v_{in2}$ that is dependent only on the quantization noise of the first modulator:

$$v_{in2}(z)=a \cdot Q_1(z)$$

This signal $v_{in2}$ is then digitized by the second first-order sigma-delta modulator, which outputs $Y_2$, then shaped to reproduce the transfer function of the first stage.

$$Y_2(Z)=Q_1(Z)FTS2(z)+Q_2(Z)FTB2(z)$$

where $Q_2(z)$ is the quantization noise of the quantizer of the second modulator, FTS2(z) is the transfer function of the input signal of the second modulator (here FTS2(z)≈$z^{-1}$) and FTB2(z) is the noise transfer function (FTB2(z)≈$(1-z^{-1})$).

Lastly, this signal is subtracted from the output of the first stage to cancel out this quantization noise. The residual quantization noise in the signal Y is then that of the second stage, which is generally, as in the case of FIG. 9, at least one first-order modulator the output noise of which is finally shaped at least to the third order (the sum of the orders of the 2 modulators). These cascaded architectures are known for their unconditional stability.

$$Y(z)=Y_1(z) \cdot z^{-1}+Y_2(z)*(1-z^{-1})^2=a_1 \cdot Vin(z) \cdot FTS1(z) \\ \cdot FTS2(z)+Q_2(z) \cdot FTB2(z) \cdot (1-z^{-1})^2$$

assuming that a=1, $k_5$=1 and c=0.

In one embodiment of the invention using such a modulator of cascaded architecture, the noise of the second sigma-delta modulator is decorrelated between the various processing channels Vi, i=0 to N−1. Very simple solutions may be implemented. The output signal of the first modulator may be injected into the second modulator with a different weight in each of the channels.

For example, by replacing the coefficient a with (a+α) on one or more processing channels, the value α being specific to the channel in question (α=$α_i$ on channel Vi and α=$α_j$ on channel Vj, i and j being distinct between 0 and N−1 and $α_i \neq α_j$), the input of the second modulator on channel Vi is differentiated with respect to the channel Vj.

$$Vin_2'(z)=a \cdot Q_1(z)+\alpha \cdot a_1 \cdot Vin(z) \cdot FTS1(z)+\alpha \cdot Q_1(z) \cdot FTB1 \\ (z)$$

This therefore amounts to injecting, into the second modulator, some of the signal and some the shaped noise of the modulator, this additional signal then influencing the quantization noise of the second modulator. By using different values of a for different processing channels Vi, the noise of each of the cascaded modulators is made to differ from channel to channel.

This additional signal injected into the second stage, which is shaped by the overall transfer function, will have no impact on the output SNR of the modulator. Since the signal undergoes the noise-shaping stages after the second modulator (by $(1-z^{-1})^2$ in the current example), it will have no influence on the output. It is even possible to cancel out its influence at the output of the second modulator by way of the coefficient c, by adapting it to the value of α.

Any modification of the second modulator that causes processing to differ from channel to channel may be employed: for example, its quantizer may be modified as seen above, or the second modulator may be a second order modulator (with coefficients $k'_1$, $k'_3$ instead of coefficients $k_1$, $k_3$ in blocks of the second modulator similar to the blocks 32,35 of the first modulator), or the channels may be differentiated via distinct values of $k'_1$ and/or $k'_3$. Another solution consists in injecting the output of the first modulator into the second modulator with a variable delay (the same delay also being applied to the input of the first quantizer injected into the second modulator) that is different for the different channels. All kinds of modifications may be made to this second modulator differently on each of the channels (or between at least certain of the channels) in order to guarantee decorrelation of the quantization noise without modifying the signal transfer function.

Another possibility with these cascaded structures is to make the value of the coefficients α vary over time with variations that are different from one channel to another.

The example shown in FIG. 9 comprises two sigma-delta modulators, but there may be a greater number of sigma-delta modulators in cascade, the $r^{th}$ modulator having as input the noise of the modulator of rank (r−1), r>1.

In embodiments, some of the various implementations of the invention that were presented above are combined together within a given multichannel transmit system.

Ideally, the invention is implemented so that there are no two processing channels in which the obtained quantization noise is identical. In embodiments, at least two of the processing channels generate different quantization noise.

Figure 10:
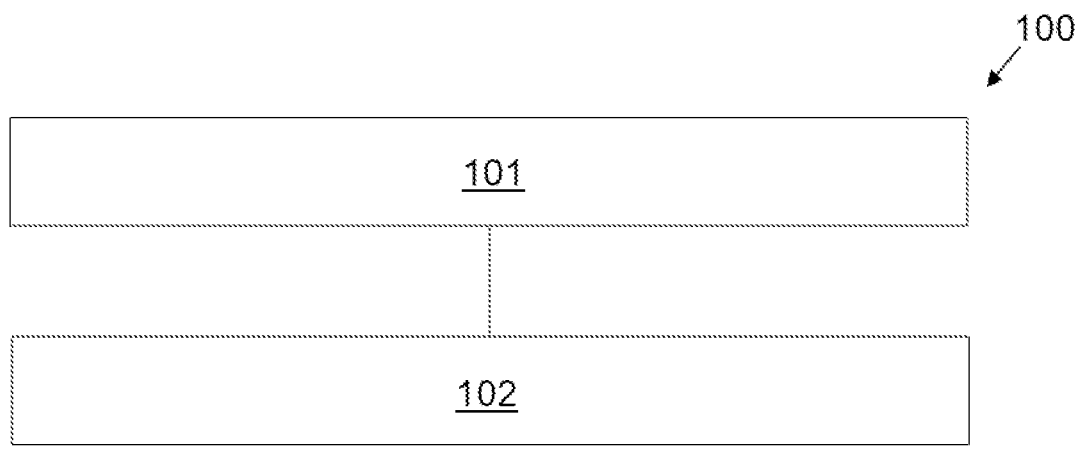
FIG. 10 is an illustration of a method for decorrelating quantization noise in a multichannel transmit-receive system in one embodiment of the invention.

The invention further provides, with reference to FIG. 10, a method 100 for decorrelating quantization noise in a multichannel transmit system, in which:
- in a step 101, an input signal is processed on a plurality of parallel processing channels Vi, i=0 to N−1, each of said channels being coupled to a transducer and comprising a converter block comprising an ADC or DAC converter and a sigma-delta modulator; and
- in a step 102, the operation of the sigma-delta modulator of channel Vi is adapted with respect to the operation of the sigma-delta modulator of channel Vj to decorrelate the quantization noise generated by these channels, so that the second term of the transfer function of the sigma-delta modulator of channel Vi is distinct from the second term of the transfer function of the sigma-delta modulator of channel Vj, the first term of said transfer function of channel Vi being equal to that of channel Vj.

To do this, the method comprises one or more of the various adaptations described above with reference to the multichannel transmit system 10.

The invention has further been described above in the context of radio-frequency signals, but it of course equally applies to other signals, for example audio-frequency signals, ultrasound signals, etc., the radio-frequency antenna then being replaced by a transducer device suitable for the type of signals being manipulated.

Furthermore, the invention has been described more precisely above with reference to a multichannel transmit system, but it is similarly applicable to multichannel receive or multichannel transmit/receive systems, in which, with respect to the above, the DAC converters are replaced by the ADC converters in the processing channels also comprising the sigma-delta modulators. The same goes for the noise decorrelation method according to the invention.

The invention is of course applicable to other types of application than beamforming.

The invention claimed is:

1. A multichannel transmit and/or receive system comprising at least N parallel processing channels (V0, V1), N≥2, each coupled to one respective transducer and each comprising a converter block comprising an ADC or DAC converter and a sigma-delta modulator,
- the transfer function of the sigma-delta modulator of each channel Vi, i=1 to N, being defined as a sum of two terms comprising a first term IN(z)·FTS(z) relating to the signal and a second term Q(z)·FTB(z) relating to the quantization noise introduced by the sigma-delta modulator and being expressed thus:

OUT(z)=IN(z)·FTS(z)+Q(z)·FTB(z), where OUT is the output signal of the sigma-delta modulator, IN is the input signal of the sigma-delta modulator, FTS is the transfer function of the input signal, Q is the quantization noise and FTB is the transfer function of the quantization noise,
- the transfer function of the sigma-delta modulator of a channel Vi being distinct from the transfer function of the sigma-delta modulator of a channel Vj, i and j being distinct integers comprised between 1 and N, in order to decorrelate the quantization noise of distinct channels,
- said multichannel system wherein, for distinct channels Vi, Vj, the second terms of the transfer function of the sigma-delta modulator only are distinct, the first term of said transfer function for channel Vi being equal to that for channel Vj.

2. The multichannel transmit and/or receive system according to claim 1, wherein the sigma-delta modulator on each of the channels Vi, Vj (V0, V1) comprises a 1-bit hysteresis quantizer, and the hysteresis cycle is different between the channels Vi, Vj in amplitude and/or temporally.

3. The multichannel transmit and/or receive system according to claim 1, wherein the sigma-delta modulator on each of the channels Vi, Vj comprises a multi-bit quantizer;
- and the value of the input signal corresponding to the switch between two quantization levels on channel Vi is set so as to be distinct from the value of the input signal corresponding to the switch between the same two quantization levels on channel Vj.

4. The multichannel transmit and/or receive system according to claim 3, comprising, on each of the channels Vi, Vj, at least said sigma-delta modulator with multi-bit quantizer and an additional sigma-delta modulator, the output of one of said modulators being input into the other of said modulators, said other sigma-delta modulator on the channel Vi being identical to said other sigma-delta modulator on the channel Vj.

5. The multichannel transmit and/or receive system according to claim 1, wherein, on each of the channels Vi, Vj, the sigma-delta modulator is a sigma-delta modulator (12") of cascaded architecture comprising at least two stages, the first stage comprising a first delta-sigma modulator especially comprising a quantizer and the second stage comprising at least a second sigma-delta modulator;
- the second stage being configured to receive as input the output of the quantizer of the first modulator and the input of the quantizer of the first modulator, to digitize, via the second comparator, a signal representative of the quantization noise of the first modulator and to shape it;

the difference between a signal proportional to the output of the quantizer of the first modulator and a signal proportional to the input of the quantizer of the first modulator being input into the second modulator;

the output of the second stage then being subtracted from the output of the first modulator to deliver a signal devoid of at least some of the quantization noise of the first stage, wherein the second stage of channel Vi is different from the second stage on channel Vj so as to differentiate between the quantization noise of the second modulator of channels Vi, Vj.

6. The multichannel transmit and/or receive system according to claim 5, wherein the second stage comprises multipliers, each multiplier multiplying its input by a respective associated coefficient, wherein, considering at least one of said multipliers, the coefficient associated with it on channel Vi has a value different from the coefficient associated with it on channel Vj.

7. The multichannel transmit and/or receive system according to claim 5, wherein a delay-generating block is placed, in the second stage, between the output of the first modulator and the input of the second modulator, said delay-generating block being configured to apply a delay to the signal delivered by said output, the delay on channel Vi being set to a value different from the value of the delay on channel Vj.

8. A method for decorrelating quantization noise in a multichannel transmit and/or receive system comprising at least N parallel processing channels, N≥2, each coupled to one respective transducer and each comprising a converter block comprising an ADC or DAC converter and a sigma-delta modulator, the transfer function of the sigma-delta modulator of each channel Vi, i=1 to N, being defined as a sum of two terms comprising a first term $IN(z) \cdot FTS(z)$ relating to the signal and a second term $Q(z) \cdot FTB(z)$ relating to the quantization noise introduced by the sigma-delta modulator (12) and being expressed as follows:

$$OUT(z)=IN(z) \cdot FTS(z)+Q(z) \cdot FTB(z),$$

where OUT is the output signal of the sigma-delta modulator, IN is the input signal of the sigma-delta modulator, FTS is the transfer function of the input signal, Q is the quantization noise and FTB is the transfer function of the quantization noise, in which method the operation of the sigma-delta modulator of channel Vi is configured with respect to the operation of the sigma-delta modulator of channel Vj to decorrelate the quantization noise generated by the channels, the transfer function of the sigma-delta modulator of a channel Vi being distinct from the transfer function of the sigma-delta modulator of a channel Vj, i and j being distinct integers comprised between 1 and N, in order to decorrelate the quantization noise of distinct channels, said method wherein, for distinct channels Vi, Vj, the second terms of the transfer function of the sigma-delta modulator only are distinct, the first term of said transfer function for channel Vi being equal to that for channel Vj.

9. The method for decorrelating quantization noise according to claim 8, wherein the sigma-delta modulator on each of the channels Vi, Vj comprises a 1-bit hysteresis quantizer, and the hysteresis cycle is different between the channels Vi, Vj in amplitude and/or temporally.

10. The method according to claim 8, wherein the sigma-delta modulator on each of the channels Vi, Vj comprises a multibit quantizer, and the value of the input signal corresponding to the switch between two quantization levels on channel Vi is set so as to be distinct from the value of the input signal corresponding to the switch between the same two quantization levels on channel Vj.

* * * * *